United States Patent
Harada

(10) Patent No.: US 6,252,530 B1
(45) Date of Patent: Jun. 26, 2001

(54) D/A CONVERTER HAVING MECHANISM FOR PREVENTING ANALOG SIGNAL DISTORTION

(75) Inventor: Hiroyuki Harada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/201,831

(22) Filed: Dec. 1, 1998

(30) Foreign Application Priority Data

Jul. 1, 1998 (JP) .................................................. 10-186160

(51) Int. Cl.$^7$ ...................................................... H03M 3/00
(52) U.S. Cl. ............................................. 341/143; 341/144
(58) Field of Search ...................................... 341/143, 144

(56) References Cited

U.S. PATENT DOCUMENTS

| | | | |
|---|---|---|---|
| 4,223,389 | * | 9/1980 | Amada et al. ........................ 364/724 |
| 4,270,027 | * | 5/1981 | Agrawal ................................ 341/155 |
| 5,325,399 | * | 6/1994 | Haspeslagh et al. .................. 375/28 |
| 5,550,544 | * | 8/1996 | Sakiyama et al. ..................... 341/155 |
| 5,629,881 | * | 5/1997 | Leeb et al. ........................ 364/724.17 |
| 5,815,102 | * | 9/1998 | Melanson .............................. 341/143 |

OTHER PUBLICATIONS

"All About Digital Audio", by Chitake Inoue; K.K. Electric Wave News Paper Office, Aug. 25, 1994.

"Oversampling A–D Converting Technology", by Akira Yukawa; Nikkei Business Publications Ltd., Dec. 25, 1990.

* cited by examiner

*Primary Examiner*—Peguy Jeanpierre
(74) *Attorney, Agent, or Firm*—McDermott, Will & Emery

(57) ABSTRACT

A D/A converter with an overflow detector for resetting a delaying unit when a digital signal overflows a specified bitprovided in a noise shaping circuit thereof.

3 Claims, 8 Drawing Sheets

FIG.3

| CLOCK | INPUT DATA | DELAYING UNIT 3a | BRANCHING POINT X | DELAYING UNIT 3b | BRANCHING POINT Y | OUTPUT FROM QUANTIZING UNIT 4 | DELAYING UNIT 3c |
|---|---|---|---|---|---|---|---|
| 1 | 32767 | 262143 | 229376 | 1048575 | 1212417 | 1 | 65534 |
| 2 | 32434 | 229376 | 196276 | 1212417 | 1343159 | 1 | 65534 |
| 3 | 31445 | 196276 | 162187 | 1343159 | 1439812 | 1 | 65534 |
| 4 | 29819 | 162187 | 126472 | 1439812 | 1500750 | 1 | 65534 |
| 5 | 27588 | 126472 | 88526 | 1500750 | 1523742 | 1 | 65534 |
| 6 | 24798 | 88526 | 47790 | 1523742 | 1505998 | 1 | 65534 |
| 7 | 21505 | 47790 | 3761 | 1505998 | 1444225 | 1 | 65534 |
| 8 | 17777 | 3761 | -43996 | 1444225 | 1334695 | 1 | 65534 |
| 9 | 13689 | -43996 | -95841 | 1334695 | 1173320 | 1 | 65534 |
| 10 | 9323 | -95841 | -152052 | 1173320 | 955734 | 1 | 65534 |
| 11 | 4768 | -152052 | -212818 | 955734 | 677382 | 1 | 65534 |
| 12 | 116 | -212818 | -278236 | 677382 | 333612 | 1 | 65534 |
| 13 | -4538 | -278236 | -348308 | 333612 | -80230 | 1 | 65534 |
| 14 | -9100 | -348308 | -291874 | -80230 | -306570 | -1 | -65534 |
| 15 | -13477 | -291874 | -239817 | -306570 | -480853 | -1 | -65534 |
| 16 | -17582 | -239817 | -191865 | -480853 | -607184 | -1 | -65534 |
| 17 | -21330 | -191865 | -147661 | -607184 | -689311 | -1 | -65534 |
| 18 | -24646 | -147661 | -106773 | -689311 | -730550 | -1 | -65534 |
| 19 | -27462 | -106773 | -68701 | -730550 | -733717 | -1 | -65534 |
| 20 | -29722 | -68701 | -32889 | -733717 | -701072 | -1 | -65534 |

FIG.4

| CLOCK | INPUT DATA | DELAYING UNIT 3a | BRANCHING POINT X | DELAYING UNIT 3b | BRANCHING POINT Y | OUTPUT FROM QUANTIZING UNIT 4 | DELAYING UNIT 3c |
|---|---|---|---|---|---|---|---|
| 1 | 32767 | 0 | -32767 | 0 | -98301 | -1 | -65534 |
| 2 | 32434 | -32767 | 65201 | -98301 | 32434 | 1 | 65534 |
| 3 | 31445 | 65201 | 31112 | 32434 | -1988 | -1 | -65534 |
| 4 | 29819 | 31112 | 126465 | -1988 | 190011 | 1 | 65534 |
| 5 | 27588 | 126465 | 88519 | 190011 | 212996 | 1 | 65534 |
| 6 | 24798 | 88519 | 47783 | 212996 | 195245 | 1 | 65534 |
| 7 | 21505 | 47783 | 3754 | 195245 | 133465 | 1 | 65534 |
| 8 | 17777 | 3754 | -44003 | 133465 | 23928 | 1 | 65534 |
| 9 | 13689 | -44003 | -95848 | 23928 | -137454 | -1 | -65534 |
| 10 | 9323 | -95848 | -20991 | -137454 | -92911 | -1 | -65534 |
| 11 | 4768 | -20991 | 49311 | -92911 | 21934 | 1 | 65534 |
| 12 | 116 | 49311 | -16107 | 21934 | -59707 | -1 | -65534 |
| 13 | -4538 | -16107 | 44889 | -59707 | 50716 | 1 | 65534 |
| 14 | -9100 | 44889 | -29745 | 50716 | -44563 | -1 | -65534 |
| 15 | -13477 | -29745 | 22312 | -44563 | 43283 | 1 | 65534 |
| 16 | -17582 | 22312 | -60804 | 43283 | -83055 | -1 | -65534 |
| 17 | -21330 | -60804 | -16600 | -83055 | -34121 | -1 | -65534 |
| 18 | -24646 | -16600 | 24288 | -34121 | 55701 | 1 | 65534 |
| 19 | -27462 | 24288 | -68708 | 55701 | -78541 | -1 | -65534 |
| 20 | -29722 | -68708 | -32896 | -78541 | -45903 | -1 | -65534 |

US 6,252,530 B1

D/A CONVERTER HAVING MECHANISM FOR PREVENTING ANALOG SIGNAL DISTORTION

FIELD OF THE INVENTION

The present invention relates to a D/A converter for converting a digital signal to an analog signal, and more specifically to a 1-bit system of D/A converter for further converting a digital signal having been converted to a 1-bit pulse to an analog signal.

BACKGROUND OF THE INVENTION

Conventionally, there has been proposed a D/A converter based on the 1-bit system as a device for converting a digital signal to an analog signal with high precision. This is achieved by improving the zero-cross distortion and linear degradation in signal conversion which occur in the conventional type of D/A converter based on the multi-bit system as described, for example, in the book All about Digital Audio (Sengaku Inoue, Denpa Shinbunsha).

Next, structure and a basic operation of the 1-bit system D/A converter based on the conventional technology is described with reference to FIG. 8. In FIG. 8, designated at the reference numeral 1 is a digital signal input terminal. 2a and 2b are adders, 3a, 3b and 3c are delaying units, 4 is a quantizing unit, 5 is a weighting section, 6 is a low-pass filter, 7 is an analog signal output terminal and 8 is a noise shaping circuit. Various configurations for this noise shaping circuit section 8 are know, however, a noise shaping circuit section 8 having three delaying units 3a, 3b, 3c and two adders 2a, 2b is considered.

In FIG. 8, at first, a digital signal having a plurality of bits is inputted into the digital signal input terminal 1. Then, this digital signal is converted to a pulse of ±1 in the quantizing unit 4 after passing through the adders 2a and 2b. This pulse is sent, after being converted to an analog signal by the low-pass filter 6, to the analog signal output terminal 7, and is, at the same time, sent to the weighting section 5, multiplied by a weight factor in the weighting section 5, sent to the delaying unit 3c, and is delayed by the delaying unit 3c, then the delayed digital signal is returned to the adders 2a, 2b respectively, and is added to the next digital signal in each of the adders 2a, 2b. The digital signal passing through the adder 2a is branched at a branch point X to be sent to the delaying unit 3a, delayed therein, returned to the adder 2a, and is added to the next digital signal in the adder 2a. Also, the digital signal passing through the adder 2b is branched at a branch point Y to be sent to the delaying unit 3b, delayed therein, returned to the adder 2b, and is added to the next digital signal in the adder 2b.

The 1-bit system D/A converter having the configuration as described above is a high-precision D/A converter with a comparatively simpler structure as compared to that of the multi-bit system of D/A converter based on the conventional technology. This is realized because of an effect of dispersing distribution of noise in the noise shaping circuit 8.

Although the noise shaping circuit 8 as described above plays an extremely important roll in the 1-bit D/A converter, there are some problems therein.

When a value held in each of the delaying units 3a, 3b becomes large immediately after the power is turned ON or due to noise entering therein, an overflow may occur in the noise shaping circuit because of a loop structure formed between the adders and delaying units. Further, the occurrence of this overflow may cause distortion in a waveform of an analog signal to be outputted.

SUMMARY OF THE INVENTION

It is an object of the present invention to provide, for solving the problems described above, a D/A converter in which a waveform of an analog signal is not distorted even when an overflow occurs in a noise shaping circuit for the 1-bit system D/A converter.

In the D/A converter of the present invention, an overflow detector is provided which passes the signal as it is when an overflow is not detected, and sends a reset signal to the delaying units when an overflow is detected and also clears the data in the delaying units.

Other objects and features of this invention will become clear from the following description with reference to the accompanying drawings.

BRIEF DESCRIPTION OF THE DRAWINGS

FIG. 3 is a view showing a result of computing by the conventional type of D/A converter;

FIG. 4 is a view showing a result of computing by the D/A converter according to Embodiment 1 of the present invention;

DESCRIPTION OF THE PREFERRED EMBODIMENTS

Figure 1:
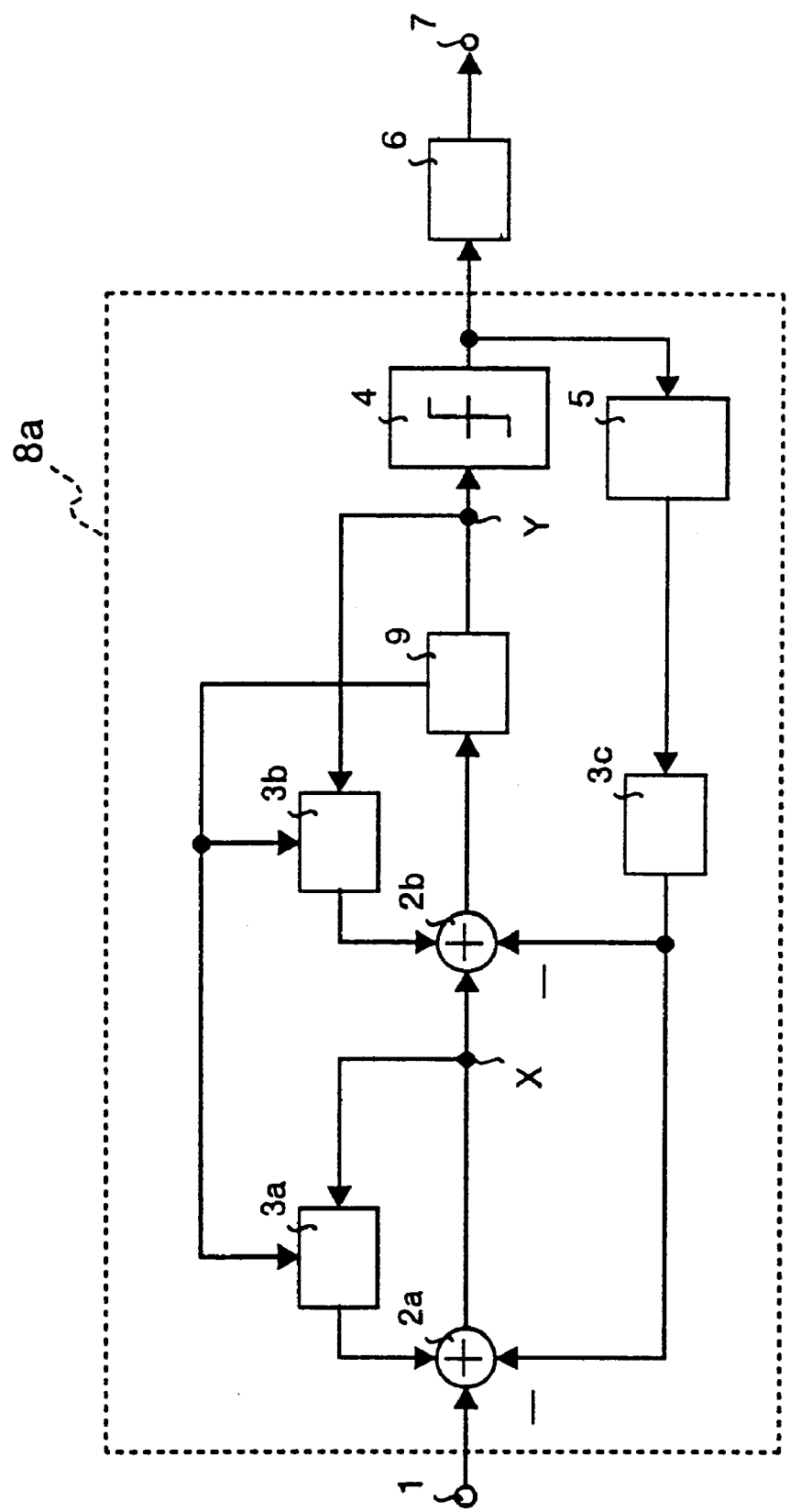
FIG. 1 is a block diagram showing Embodiment 1 of a D/A converter according to the present invention.
Figure 8:
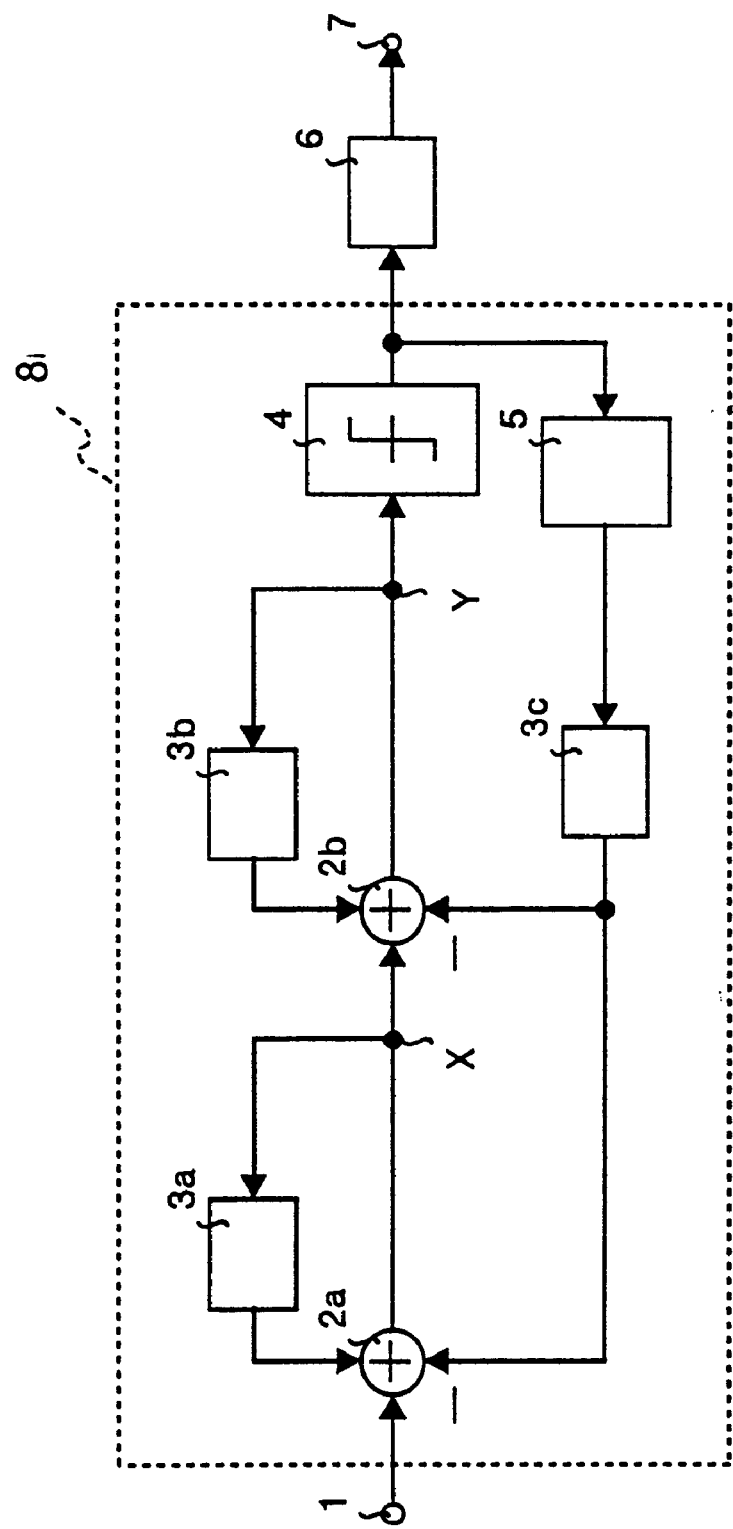
FIG. 8 is a block diagram showing an example of a conventional type of D/A converter.

Description is made hereinafter for Embodiment 1 of the present invention with reference to FIG. 1. In FIG. 1, designated at the reference numeral 1 is a digital signal input terminal. 2a and 2b are adders, 3a, 3b and 3c are delaying units, 4 is a quantizing unit, 5 is a weighting section, 6 is a low-pass filter, 7 is an analog signal output terminal, 8a is a noise shaping circuit and 9 is an overflow detector. As compared to FIG. 8 showing the structure based on the conventional technology, the overflow detector 9 is newly provided in this configuration.

Next description is made for operations referring to FIG. 1.

In FIG. 1, at first, a digital signal having a plurality of bits is inputted into the digital signal input terminal 1. Then, this digital signal is converted to a pulse of ±1 in the quantizing unit 4 after passing through the adders 2a and 2b and the overflow detector 9. This pulse is sent, after being converted to an analog signal by the low-pass filter 6, to the analog signal output terminal 7, and is, at the same time, sent to the weighting section 5, multiplied by a weight factor in the weighting section 5, sent to the delaying unit 3c, and is delayed by the delaying unit 3c, then the delayed digital signal is returned to the adders 2a, 2b respectively, and is added to the next digital signal in each of the adders 2a, 2b. The digital signal passing through the adder 2a is branched at a branch point X to be sent to the delaying unit 3a, delayed therein, returned to the adder 2a, and is added to the next digital signal in the adder 2a. Also, the digital signal passing through the overflow detector 9 is branched at a branch point Y to be sent to the delaying unit 3b, delayed therein, returned to the adder 2b, and is added to the next digital signal in the adder 2b.

Herein, the overflow detector 9 passes the as it is, when a signal outputted from the adder 2b does not overflow a preset number of bits. On the other hand, sends a reset signal to the delaying units 3a and 3b when the signal overflows and clears the data in the delaying units.

Figure 2:
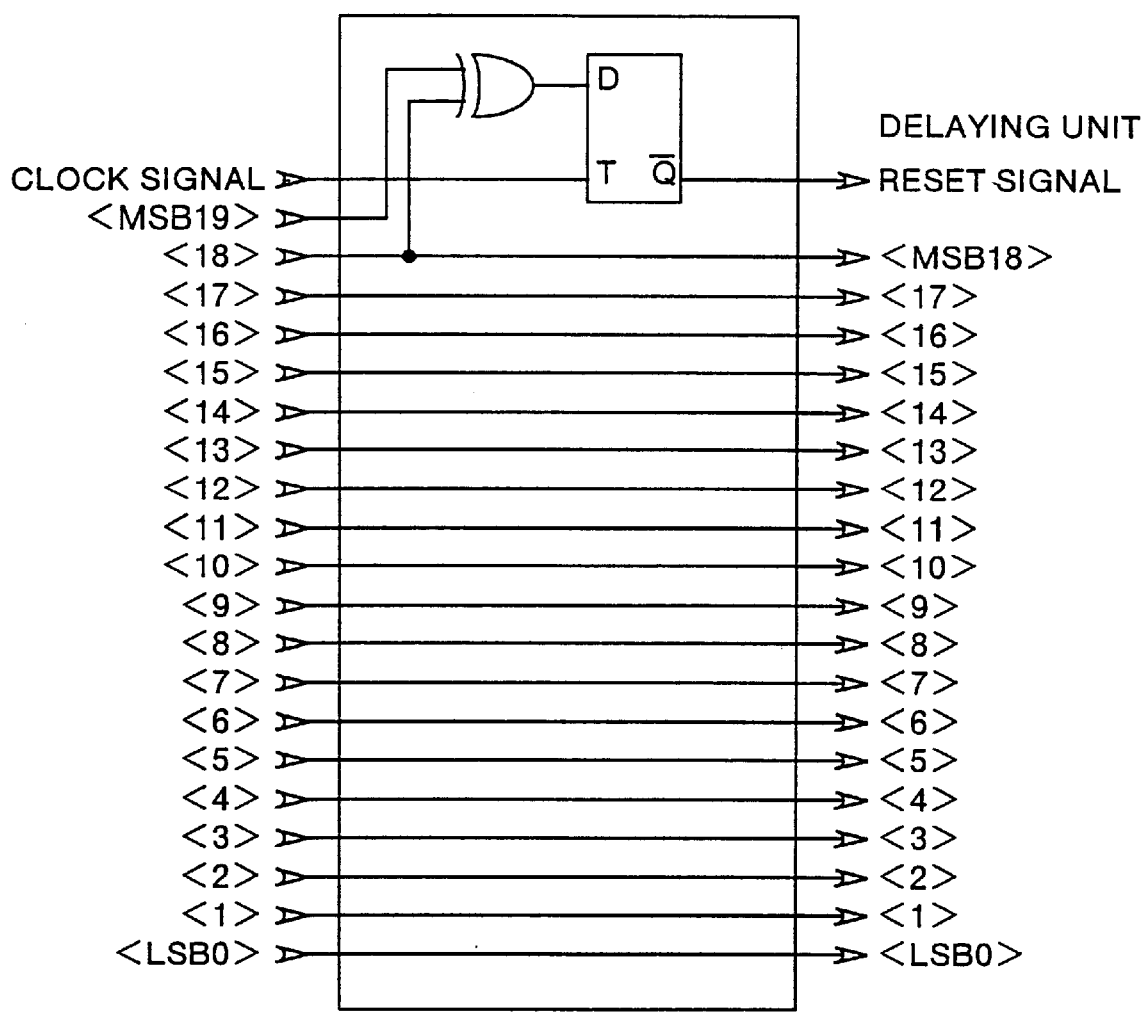
FIG. 2 is a view showing an overflow detector according to the present invention.

FIG. 2 shows a particular example of a structure of the overflow detector 9.

The overflow detector 9 shown in FIG. 2 passes therethrough signals corresponding to up to 18th bit as they are, computes exclusive-ORs between signals corresponding to the 18th bit and 19th bit for the signals overflowing the 18th bit, and issues a reset signal to the delaying units 3a and 3b. If a signal underflows, the overflow detector 9 can even also issue a reset signal to the delaying units 3a and 3b like in the case of overflow.

Even when values stored in the delaying unit 3a and 3b become large, for example, immediately after the power is turned ON or due to noises entering therein, occurrence of an overflow in the noise shaping circuit 8a can be prevented. Further, occurrence of distortion in a waveform of an analog signal to be outputted due to an overflow can be prevented from its occurrence.

Detailed description is made for an operation of the D/A converter according to the present invention with particular numeric values with reference to FIG. 3 and FIG. 4.

FIG. 3 is a view for explaining a state where an overflow of data occurs by using concrete numeric values in the 1-bit system of D/A converter based on the conventional technology shown in FIG. 8.

In FIG. 3, it is assumed that the delaying unit 3a is in a range from $+2^{18-1}$ to $-2^{18}$, the delaying unit 3b is in a range from $+2^{-20-1}$ to $-2^{20}$, and input data is in a range from +32767 to −32767. Weight factor is assumed to be 65534.

If data 262143 and data 1048575 are now stored in the delaying unit 3a and the delaying unit 3b respectively as an initial value, and when a signal in each column of the input data in FIG. 3 is inputted at each clock, each data value of the delaying unit 3a, branch point X, delaying unit 3b, branch point Y, output from the quantizing unit 4, and of the delaying unit 3c is as shown in FIG. 3 respectively.

Namely, when the data 32767 is inputted in the input terminal 1 at the first clock, the data 262143 having been in the delaying unit 3a is added thereto in the adder 2a, the data 65534 in the delaying unit 3c is subtracted, so that an output from the adder 2a, namely a value at the branch point X is 229376. Then, the data 1048575 in the delaying unit 3b is added to the data at the branch point X, the data 65534 in the delaying unit 3c is subtracted, so that an output from the adder 2a, namely a value at the branch point Y is 1212417, and the quantizing unit 4 outputs +1.

At the second clock, the previously obtained value 229376 at the branch point X is inputted in the delaying unit 3a, the previously obtained value 1212417 at the branch point Y is inputted in the delaying unit 3b, the value 65534 obtained by multiplying +1 as an output from the quantizing unit 4 by the weight factor 65534 is inputted in the delaying unit 3c, and the same computing as that in the first clock is repeated hereinafter to the input data 32434 in the second clock.

FIG. 3 shows a result of computing as described above for up to the 20th clock.

Herein, figures indicated in italics, namely at the 13th to 15th clocks for the delaying unit 3a and at the 2nd to 10th clocks for the delaying unit 3b have overflown (underflown in a case of a negative value) the values $+2^{18-1}$ to $-2^{18}$ and $++2^{20-1}$ to $-2^{20}$ originally set in the delaying units 3a and 3b. When the overflow or underflow described above occurs, inputted digital signal can not accurately be converted to an analog signal, and the waveform is distorted from the original waveform.

On the contrary, FIG. 4 is a view for explaining a state by using particular numeric values where an overflow or underflow of data is suppressed in the 1-bit system D/A converter according to one embodiment of the present invention as shown in FIG. 1.

FIG. 4 shows a result of computing on the same conditions as described above excluding the condition that each initial value in the delaying units 3a and 3b is set to zero by the operation of the overflow detector 9 as compared to the operation based on the conventional technology described in FIG. 3. In FIG. 4, no overflow (or no underflow) is found, and for this reason it is easily understood that an excellent effect is provided by the overflow detector according to the present invention.

Figure 5:
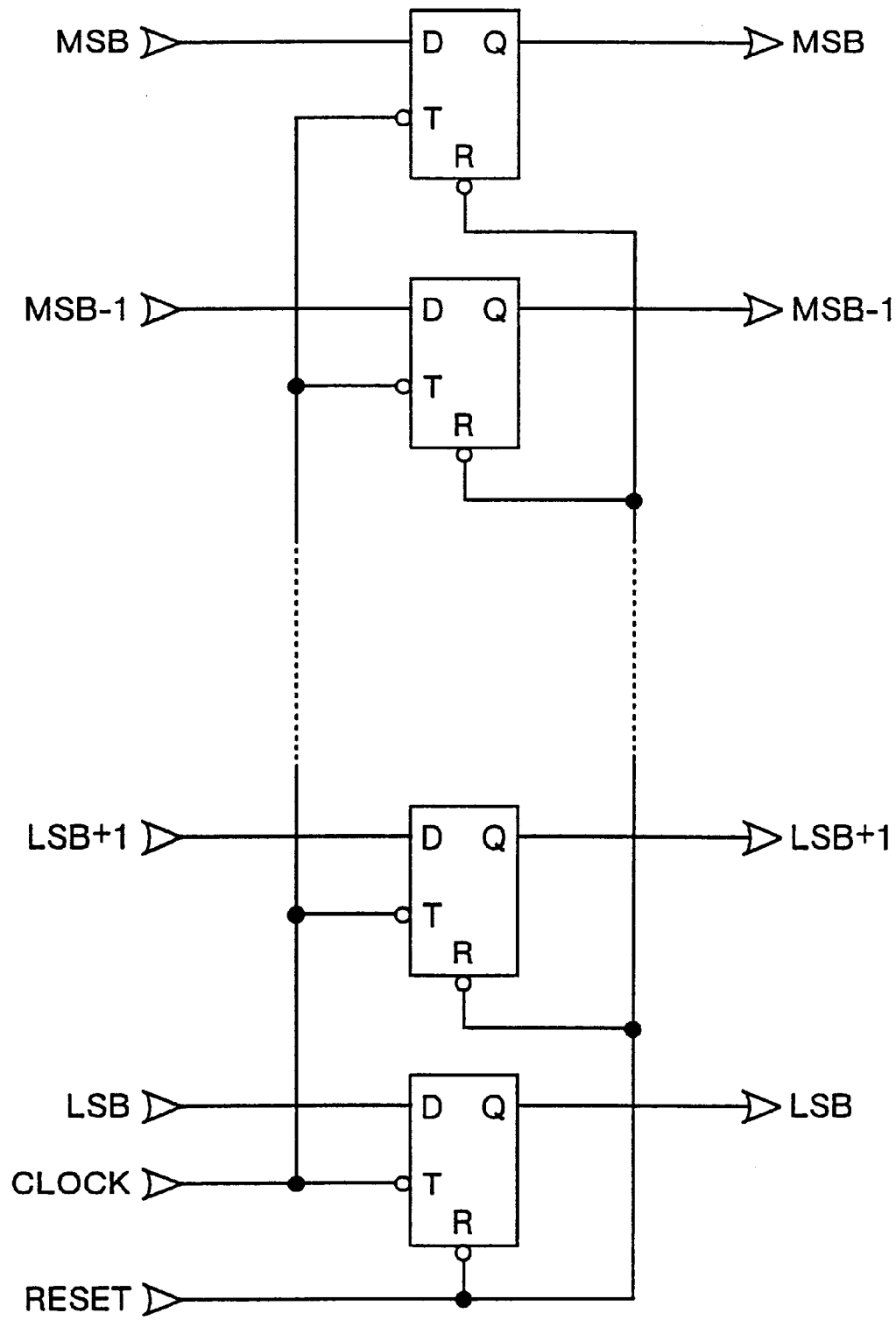
FIG. 5 is a view showing a delaying unit according to the present invention.

Also, the delaying unit according to the present invention may employ any structure on the condition that the delaying unit can delay a digital signal in a range from one clock to a plurality of clocks. An examples of a delaying unit for delaying one clock with a flip-flop is shown in FIG. 5 as a typical one.

As described above, the present invention shown in FIG. 1 provides a high-precision D/A converter in which there is no distortion in an output analog signal which has conventionally occurred because of an overflow or underflow of a data signal.

Figure 6:
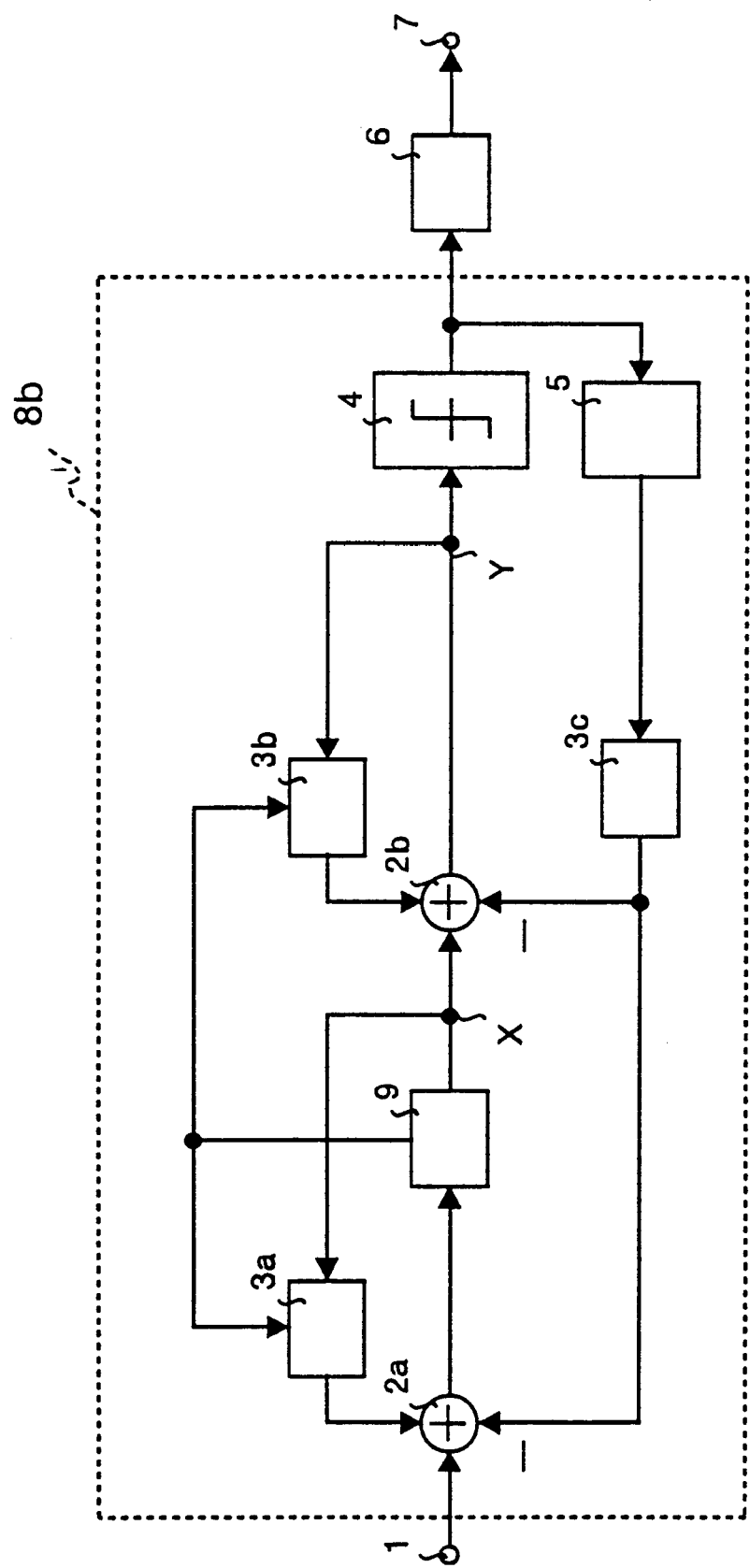
FIG. 6 is a block diagram showing Embodiment 2 of a D/A converter according to the present invention.

FIG. 6 shows a second embodiment of the present invention.

The difference between FIG. 6 and FIG. 1 is that, the overflow detector 9 is located between the adders 2a and 2b in FIG. 6 while it is located after the adder 2b in FIG. 1.

In the D/A converter having the configuration as described above, it is possible to obtain a high-precision D/A converter, similarly to Embodiment 1, in which there is no distortion in an output analog signal caused by an overflow or underflow of a digital signal in the noise shaping circuit 8b.

Figure 7:
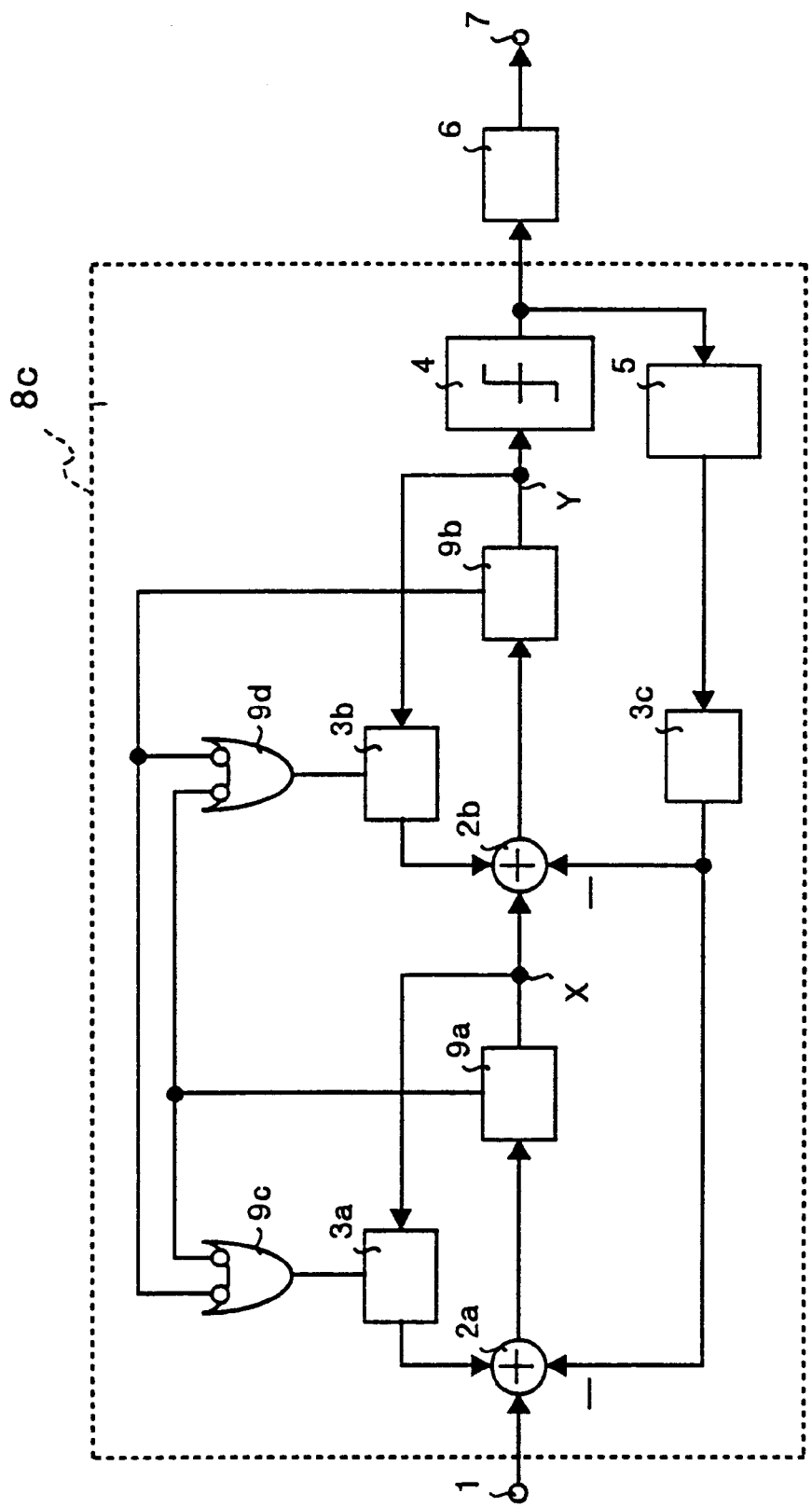
FIG. 7 is a block diagram showing Embodiment 3 of a D/A converter according to the present invention.

FIG. 7 shows a third embodiment of the present invention.

The difference between FIG. 7 and FIG. 1 is that, in the noise shaping circuit 8c, two units of overflow detector 9a and 9b are provided, and further two units of double-input OR circuits 9c and 9d for inputting output from the overflow detectors 9a and 9b are provided. The delaying units 3a and 3b are connected to the OR circuits 9c and 9d respectively so that both of the delaying units can be reset by output from the overflow detectors 9a and 9b respectively.

The D/A converter having the configuration as described above can immediately reset the delaying units 3a and 3b even in any case where an overflow or an underflow occurs after data is added by the adders 2a and 2b, so that a still higher-precision D/A converter can be obtained.

With the invention, a noise shaping circuit for the D/A converter comprises an adder for adding a digital signal inputted by a digital signal input terminal to the digital signal obtained by being added by the adder and further being delayed by a first delaying unit as well as to the digital signal obtained by being added by the adder, being quantized by a quantizing unit, and further being delayed by a second delaying unit; and an overflow detector for resetting the first delaying unit when the digital signal after being added by the adder overflows a specified bit, so that occurrence of an overflow in the noise shaping circuit can be prevented, and for this reason, distortion in a waveform of an output analog signal can be prevented.

With the invention, a noise shaping circuit for the D/A converter having a plurality of adders and first delaying units comprises a single overflow detector for resetting the plurality of first delaying units when the digital signal overflows a specified bit, so that occurrence of an overflow in the noise shaping circuit can be prevented, and for this reason, distortion in a waveform of an output analog signal can be prevented.

With the invention, a noise shaping circuit for the D/A converter having a plurality of adders and first delaying units comprises a plurality of overflow detectors for resetting the plurality of first delaying units when the digital signal overflows a specified bit, so that occurrence of an overflow in the noise shaping circuit can be prevented, and for this reason, distortion in a waveform of an output analog signal can be prevented.

This application is based on Japanese patent application No. HEI 10-186160 filed in the Japanese Patent Office on Jul. 1, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A D/A converter comprising:

a digital signal input terminal, a noise shaping circuit, a low-pass filter, and an analog signal output terminal;

said noise shaping circuit having an adder, first and second delaying units, a quantizing unit and an overflow detector;

wherein said adder adds a digital signal input from said digital signal input terminal to an output signal of said adder delayed by said first delaying unit and to the output signal of said adder quantized by said quantizing unit, and further delayed by said second delaying unit; and said overflow detector resets said first delaying unit when the digital signal after being added by said adder overflows a specified bit.

2. A D/A converter according to claim 1, wherein said noise shaping circuit comprises a plurality of said adders and plurality of said first delaying units; and said overflow detector resets said plurality of first delaying units when the digital signal overflows a specified bit.

3. A D/A converter according to claim 1, wherein said noise shaping circuit comprises a plurality of said adders and plurality of said first delaying units; and a plurality units of said overflow detectors reset each of said plurality of first delaying units when the digital signal overflows a specified bit.

* * * * *